(12) United States Patent
Crouch et al.

(10) Patent No.: US 11,924,963 B2
(45) Date of Patent: Mar. 5, 2024

(54) PRINTED-CIRCUIT ISOLATION BARRIER FOR CO-SITE INTERFERENCE MITIGATION

(71) Applicant: Raytheon Company, Waltham, MA (US)

(72) Inventors: David D. Crouch, Farragut, TN (US); Jennifer Marie de la Barrera, Norman, OK (US)

(73) Assignee: Raytheon Company, Tewksbury, MA (US)

( * ) Notice: Subject to any disclaimer, the term of this patent is extended or adjusted under 35 U.S.C. 154(b) by 224 days.

(21) Appl. No.: 17/649,875

(22) Filed: Feb. 3, 2022

(65) Prior Publication Data
US 2023/0247757 A1    Aug. 3, 2023

(51) Int. Cl.
| | | |
|---|---|---|
| *H01Q 1/38* | (2006.01) | |
| *H01P 1/365* | (2006.01) | |
| *H01Q 1/48* | (2006.01) | |
| *H01Q 1/52* | (2006.01) | |
| *H01Q 17/00* | (2006.01) | |

(Continued)

(52) U.S. Cl.
CPC ........ *H05K 1/0216* (2013.01); *H01P 1/365* (2013.01); *H01Q 1/38* (2013.01); *H01Q 1/48* (2013.01); *H01Q 1/525* (2013.01); *H01Q 17/00* (2013.01); *H05K 1/0206* (2013.01); *H05K 3/4644* (2013.01); *H05K 2201/10098* (2013.01)

(58) Field of Classification Search
CPC . H01L 17/00; H01L 1/525; H01L 1/48; H01L 1/38
See application file for complete search history.

(56) References Cited

U.S. PATENT DOCUMENTS

| | | |
|---|---|---|
| 5,576,710 A | 11/1996 | Broderick et al. |
| 7,427,949 B2 | 9/2008 | Channabasappa et al. |
| 7,608,326 B2 | 10/2009 | Johnson |

(Continued)

FOREIGN PATENT DOCUMENTS

| | | |
|---|---|---|
| CN | 112713410 A | 4/2021 |
| EP | 3196976 A1 | 7/2017 |

(Continued)

OTHER PUBLICATIONS

International Search Report dated Dec. 1, 2020 in connection with International Patent Application No. PCT/US2020/053255, 4 pages.

(Continued)

*Primary Examiner* — Graham P Smith

(57) ABSTRACT

An apparatus includes an isolation barrier configured to absorb electromagnetic energy. The isolation barrier includes multiple layers stacked on one another. Each of the multiple layers includes at least one dielectric material, at least one thin-film resistive material carried by the at least one dielectric material, and conductive strips in electrical contact with the at least one thin-film resistive material. The isolation barrier also includes vias through the multiple layers. Multiple ones of the vias are positioned along each of the conductive strips, and the vias electrically couple the conductive strips in the multiple layers to one another. The isolation barrier is configured to guide the electromagnetic energy through the multiple layers to enable absorption of the electromagnetic energy by the at least one thin-film resistive material.

20 Claims, 5 Drawing Sheets

(51) Int. Cl.
*H05K 1/02* (2006.01)
*H05K 3/46* (2006.01)

(56) References Cited

U.S. PATENT DOCUMENTS

| | | |
|---|---|---|
| 10,454,180 B2 | 10/2019 | Kim et al. |
| 2003/0112186 A1 | 6/2003 | Sanchez et al. |
| 2010/0156695 A1 | 6/2010 | Sim et al. |
| 2014/0097995 A1 | 4/2014 | McKinzie, III |
| 2015/0009084 A1 | 1/2015 | Coupa et al. |
| 2015/0141268 A1 | 5/2015 | Rothberg et al. |
| 2015/0171498 A1 | 6/2015 | McKinzie, III |
| 2016/0233173 A1 | 8/2016 | Do et al. |
| 2017/0317424 A1 | 11/2017 | Sim et al. |
| 2017/0346179 A1 | 11/2017 | Wu et al. |
| 2018/0191052 A1 | 7/2018 | Ndip et al. |
| 2018/0337447 A1 | 11/2018 | Shinojima |
| 2019/0215948 A1 | 7/2019 | Arnitz et al. |
| 2021/0210862 A1 | 7/2021 | Holdstock et al. |

FOREIGN PATENT DOCUMENTS

| | | |
|---|---|---|
| WO | 2007069367 A1 | 6/2007 |
| WO | 2007080368 A1 | 7/2007 |
| WO | 2013182104 A1 | 12/2013 |
| WO | 2016209181 A1 | 12/2016 |

OTHER PUBLICATIONS

Written Opinion of the International Searching Authority dated Dec. 1, 2020 in connection with International Patent Application No. PCT/US2020/053255, 6 pages.

Laird Technologies, "Eccosorb(R) MF Lossy, Magnetically Loaded, Machinable Stock, " 2015, 5 pages.

Laird Technologies, "Hybrid Thermal Transfer/EMI Absorber, CoolZorb 400 Series," May 2019, 2 pages.

Mast Technologies, "Supperss-n-Sink Dual Use RF Absorber + Thermal Pad," Nov. 2013, 1 page.

Sandora, "Isolation Improvement with Electromagnetic Band Gap Surfaces," Lincoln Laboratory Journal, vol. 19, No. 1, 2012, pp. 51-61.

US 11,924,963 B2

PRINTED-CIRCUIT ISOLATION BARRIER FOR CO-SITE INTERFERENCE MITIGATION

TECHNICAL FIELD

This disclosure is directed in general to radio frequency (RF) isolation. More specifically, this disclosure relates to a printed-circuit isolation barrier for co-site interference mitigation.

BACKGROUND

When multiple antennas operate in the same frequency band on the same platform, it can be important to minimize the amount of energy that gets coupled from one antenna to one or more other antennas. Among other reasons, this is because one or more high-power emitters on a platform can introduce significant distortions in one or more other systems of the platform. This problem becomes worse as more-capable systems are developed with higher transmit powers, wider bandwidths, and multiple functions (particularly on smaller platforms).

SUMMARY

This disclosure provides a printed-circuit isolation barrier for co-site interference mitigation.

In a first embodiment, an apparatus includes an isolation barrier configured to absorb electromagnetic energy. The isolation barrier includes multiple layers stacked on one another. Each of the multiple layers includes at least one dielectric material, at least one thin-film resistive material carried by the at least one dielectric material, and conductive strips in electrical contact with the at least one thin-film resistive material. The isolation barrier also includes vias through the multiple layers. Multiple ones of the vias are positioned along each of the conductive strips, and the vias electrically couple the conductive strips in the multiple layers to one another. The isolation barrier is configured to guide the electromagnetic energy through the multiple layers to enable absorption of the electromagnetic energy by the at least one thin-film resistive material.

In a second embodiment, a system includes a ground plane and multiple antennas each configured to transmit or receive electromagnetic signals. The system also includes at least one isolation barrier configured to absorb electromagnetic energy transmitted from one of the antennas in order to reduce an amount of the electromagnetic energy received at another of the antennas. Each isolation barrier includes multiple layers stacked on one another. Each of the multiple layers includes at least one dielectric material, at least one thin-film resistive material carried by the at least one dielectric material, and conductive strips in electrical contact with the at least one thin-film resistive material. Each isolation barrier also includes vias through the multiple layers. Multiple ones of the vias are positioned along each of the conductive strips, and the vias electrically couple the conductive strips in the multiple layers to one another and to the ground plane. Each isolation barrier is configured to guide the electromagnetic energy through the multiple layers to enable absorption of the electromagnetic energy by the at least one thin-film resistive material.

In a third embodiment, a method includes forming an isolation barrier configured to absorb electromagnetic energy transmitted from one of multiple antennas in order to reduce an amount of the electromagnetic energy received at another of the multiple antennas. Forming the isolation barrier includes forming multiple layers stacked on one another. Each of the multiple layers includes at least one dielectric material, at least one thin-film resistive material carried by the at least one dielectric material, and conductive strips in electrical contact with the at least one thin-film resistive material. Forming the isolation barrier also includes forming vias through the multiple layers. Multiple ones of the vias are positioned along each of the conductive strips, and the vias electrically couple the conductive strips in the multiple layers to one another. The isolation barrier is configured to guide the electromagnetic energy through the multiple layers to enable absorption of the electromagnetic energy by the at least one thin-film resistive material.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

Figure 1:
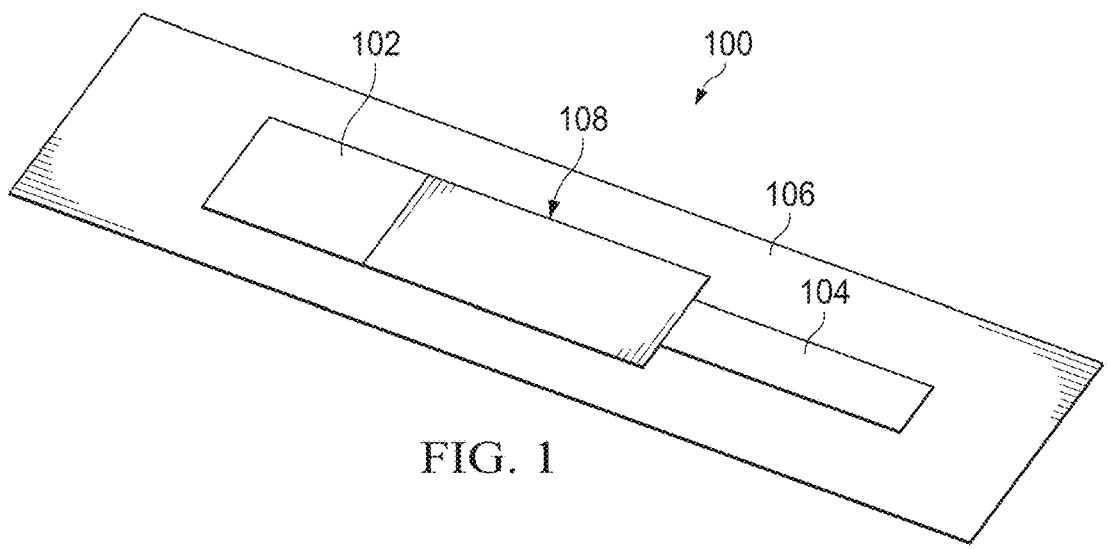
FIG. 1 illustrates an example system supporting co-site interference mitigation in accordance with this disclosure.

FIGS. 1 through 6, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, when multiple antennas operate in the same frequency band on the same platform, it can be important to minimize the amount of energy that gets coupled from one antenna to one or more other antennas. Among other reasons, this is because one or more high-power emitters on a platform can introduce significant distortions in one or more other systems of the platform. This problem becomes worse as more-capable systems are developed with higher transmit powers, wider bandwidths, and multiple functions (particularly on smaller platforms).

Some approaches for mitigating energy coupling between antennas (referred to as co-site interference mitigation) involve relocating one or more of the antennas so that larger distances exist between the antennas. However, these approaches are not feasible unless adequate space is available. Also, these approaches may not be viable due to cost or space limitations, particularly when low-frequency radio frequency (RF) systems are involved. Other approaches for co-site interference mitigation involve utilizing a radar absorbing material (RAM) to reduce reflections and dampen surface waves between antennas. However, to maintain its effectiveness, a layer of radar absorbing material often needs to have a larger thickness as the frequency of the RF energy being transmitted (and being absorbed by the radar absorbing material) is reduced, which can increase space and weight requirements.

This disclosure provides a printed-circuit isolation barrier for co-site interference mitigation. As described in more detail below, the isolation barrier includes a printed circuit structure with a corrugated structure having conductive circuit traces and conductive vias. RF energy that is received by the isolation barrier during transmission can be absorbed by thin-film resistive layers within the isolation barrier itself. Among other things, this approach uses printed circuit board (PCB) fabrication technology to realize a low-cost corrugated slow-wave structure as the isolation barrier, which can help to simplify fabrication and reduce fabrication costs. Moreover, the embedding of the thin-film resistive layers into the structure of the isolation barrier can reduce or eliminate the need to use bulky radar absorbing material. Further, narrow gaps may be formed in the thin-film resistive layers of the isolation barrier, which can help to enhance the isolation barrier's low-frequency performance without the need for high-dielectric constant materials or thick dielectric layers. In addition, walls of corrugations in the isolation barrier can be formed by the vias, which can also serve to conduct heat from the isolation barrier into a platform to which the isolation barrier is attached and thereby enable effective thermal management.

FIG. 1 illustrates an example system 100 supporting co-site interference mitigation in accordance with this disclosure. As shown in FIG. 1, the system 100 includes multiple antennas 102 and 104 and a ground plane 106. Each antenna 102 and 104 generally represents an antenna used to transmit and/or receive RF signals or other electromagnetic energy. In some cases, one antenna 102 or 104 may be used for transmitting RF signals while the other antenna 104 or 102 is being used for receiving RF signals. Each antenna 102 and 104 may be used for any suitable purpose(s), and different antennas 102 and 104 may be used for a common purpose or for different purposes. As a particular example, one antenna 102 or 104 may be used for communication, and the other antenna 104 or 102 may be used for sensing.

Each antenna 102 and 104 represents any suitable structure configured to transmit and/or receive RF signals or other electromagnetic energy. Each antenna 102 and 104 may be formed from any suitable material(s), such as one or more electrically-conductive materials like copper or other metal(s). Each antenna 102 and 104 may also be formed in any suitable manner. Further, in this example, the antenna 102 appears more square and the antenna 104 appears more elongated, although this is for illustration only. Each antenna 102 and 104 may have any suitable size, shape, and dimensions, and the antennas 102 and 104 may or may not have a common size, a common shape, and/or common dimensions. In addition, while this example shows two antennas 102 and 104, the system 100 may have any other suitable number of antennas, where at least two of the antennas are to be at least partially isolated.

The antennas 102 and 104 may be positioned at any suitable locations within a larger system. In some cases, for example, the antennas 102 and 104 may be located at different positions on a land-based vehicle (such as a civilian or military automotive vehicle like a car, truck, sport utility vehicle, van, or transport), a water-based vehicle (such as a ship or other vessel), or an airborne vehicle (such as a civilian or military aircraft like a plane or drone). In these embodiments, the antennas 102 and 104 may be used for communication purposes, radar or other sensing purposes, and/or other purposes. As a particular example, at least one of the antennas 102 and 104 may be used in a civilian or military automotive vehicle for performing automotive radar functions, which may be useful in applications such as driver assistance, self-driving, or collision warning or avoidance applications. In other cases, the antennas 102 and 104 may be used on towers or other structures to support functions such as 5G communications or other advanced communications functions. In general, this disclosure is not limited to use of multiple antennas with any particular applications or functions. As a particular example of this, while FIG. 1 depicts a pair of flush-mounted antennas 102, 104, any other suitable types of antennas may be used here, such as blade antennas (which are widely used on aircraft).

The ground plane 106 represents a conductive surface having a larger size relative to the antennas 102 and 104. The ground plane 106 is typically coupled to an electrical ground and can be used to reflect RF signals or other electromagnetic energy during operation. The ground plane 106 may be formed from any suitable material(s), such as one or more electrically-conductive materials like copper or other metal(s). The ground plane 106 may also be formed in any suitable manner. Further, in this example, the ground plane 106 appears more elongated, although this is for illustration only. The ground plane 106 may have any suitable size, shape, and dimensions. Note that, in some cases, the ground plane 106 may actually represent the surface of a platform on which the antennas 102-104 are installed, such as when the ground plane 106 represents a conductive portion of a land-based vehicle, water-based vehicle, or airborne vehicle.

In this example, a printed-circuit isolation barrier 108 is provided for co-site interference mitigation, which means that the isolation barrier 108 helps to at least partially block RF signals or other electromagnetic energy transmitted by one antenna 102 or 104 from reaching the other antenna 104 or 102. Note that perfect isolation is typically not achievable in real-world conditions, but a significant blockage of electromagnetic energy can still be useful and greatly increase the isolation between two RF-based systems (such as two RF-based systems using different antennas 102 and 104).

As described in more detail below, the isolation barrier 108 includes a printed circuit structure, which includes components defining a corrugated structure. The corrugated structure is able to receive and absorb RF signals or other electromagnetic energy, which helps to provide isolation between the antennas 102 and 104. The conductive circuit traces can include multiple layers of copper or other conductive strips that are electrically coupled to thin-film resistive structures, and conductive vias can be used to electrically couple the multiple layers together. This forms a compact structure that is able to effectively absorb RF signals or other electromagnetic energy, and the vias and other components of the isolation barrier 108 can be used to conduct heat from the isolation barrier 108 (such as into the ground plane 106 or other structure). Note that having vias connecting all metal layers to the ground plane 106 can be useful both electrically and thermally since the vias can provide a low-resistance thermal path for heat to be conducted from the structure into the ground plane 106. Also note that the isolation barrier 108 here can function as a low-profile surface-wave absorber, which can provide high insertion loss over a wide bandwidth. The corrugated structure also uses corrugations to guide electromagnetic energy through the multiple layers of the thin-film resistive structures, and electromagnetic energy can be trapped within the corrugations in order to enable effective termination of that electromagnetic energy.

In this particular example, the isolation barrier 108 is elongated, and the antennas 102 and 104 are positioned at opposite ends of the isolation barrier 108 along shorter sides of the isolation barrier 108. However, this is for illustration only and can easily vary as needed or desired. For example, the antennas 102 and 104 may both be positioned along a single longer side of the isolation barrier 108, such as at or near opposite ends of the longer side. As another example, the antennas 102 and 104 may be positioned along different longer sides of the isolation barrier 108, such as when the antennas 102 and 104 are positioned diagonally or catty-corner relative to one another. In general, the antennas 102 and 104 may be any suitable positions relative to one another and relative to the isolation barrier 108.

Depending on the embodiment, the isolation barrier 108 may be easily fabricated using standard PCB fabrication technology, which helps to simplify fabrication and reduce fabrication costs. Also, bulky radar absorbing materials may not be needed with the isolation barrier 108, which can further help to reduce costs and can reduce size and weight requirements. Further, gaps may be formed between the thin-film resistive structures to enhance the isolation barrier's low-frequency performance.

Moreover, the isolation barrier 108 provides for improved thermal management since heat can be easily removed from the isolation barrier 108. In addition, in some cases, the isolation barrier 108 may be formed or included as an integral part of a radiating antenna or other antenna. Additional details regarding example embodiments of the isolation barrier 108 are provided below.

Although FIG. 1 illustrates one example of a system 100 supporting co-site interference mitigation, various changes may be made to FIG. 1. For example, the sizes, shapes, and dimensions of the system 100 and its individual components can vary as needed or desired, and various elements can be repositioned within the system 100 as needed or desired. Also, the number and placement of the antennas and isolation barriers can vary as needed or desired.

Figure 2B:
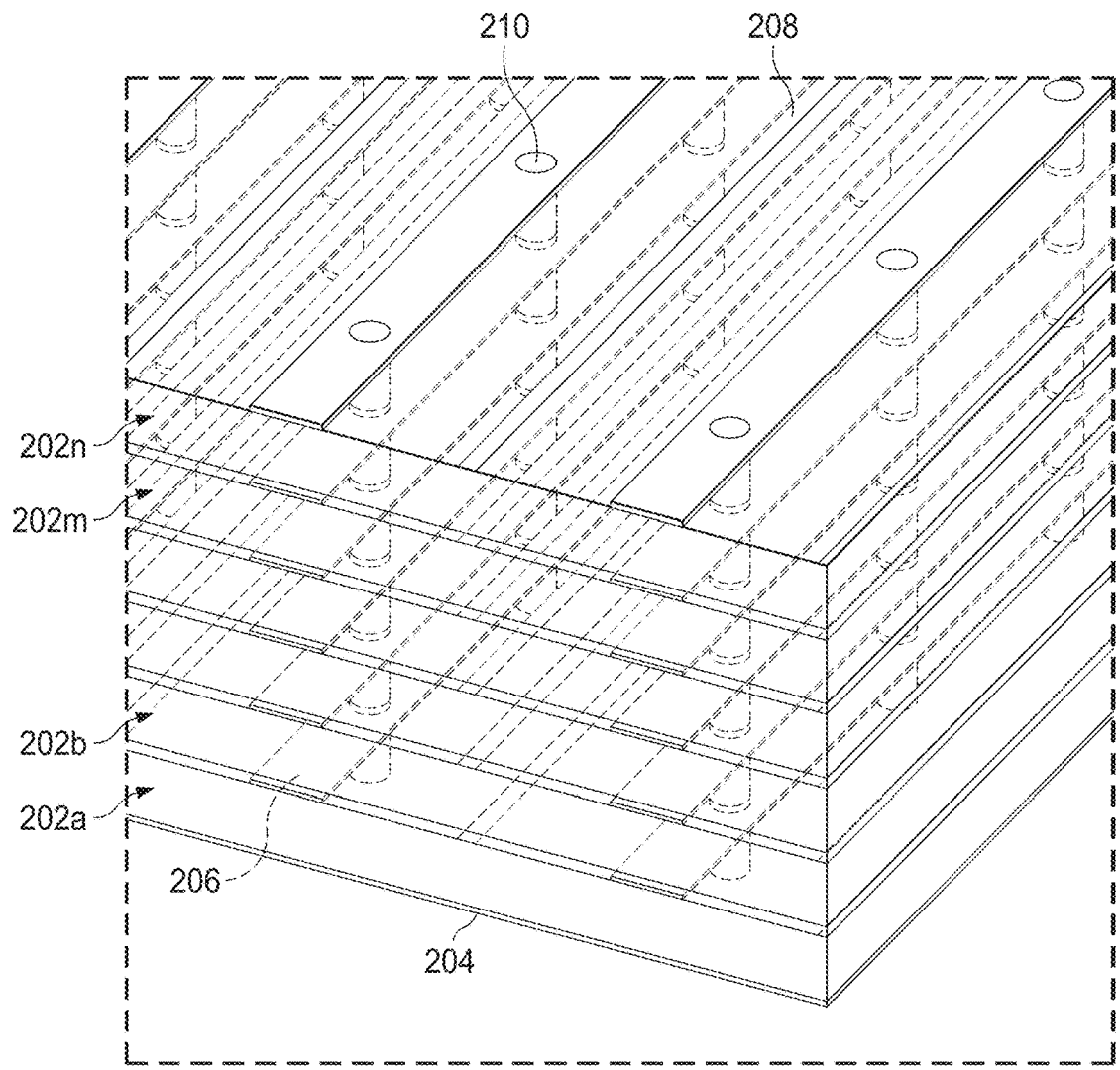
FIGS. 2A and 2B illustrate a perspective view of an example printed-circuit isolation barrier for co-site interference mitigation in accordance with this disclosure.
Figure 2A:
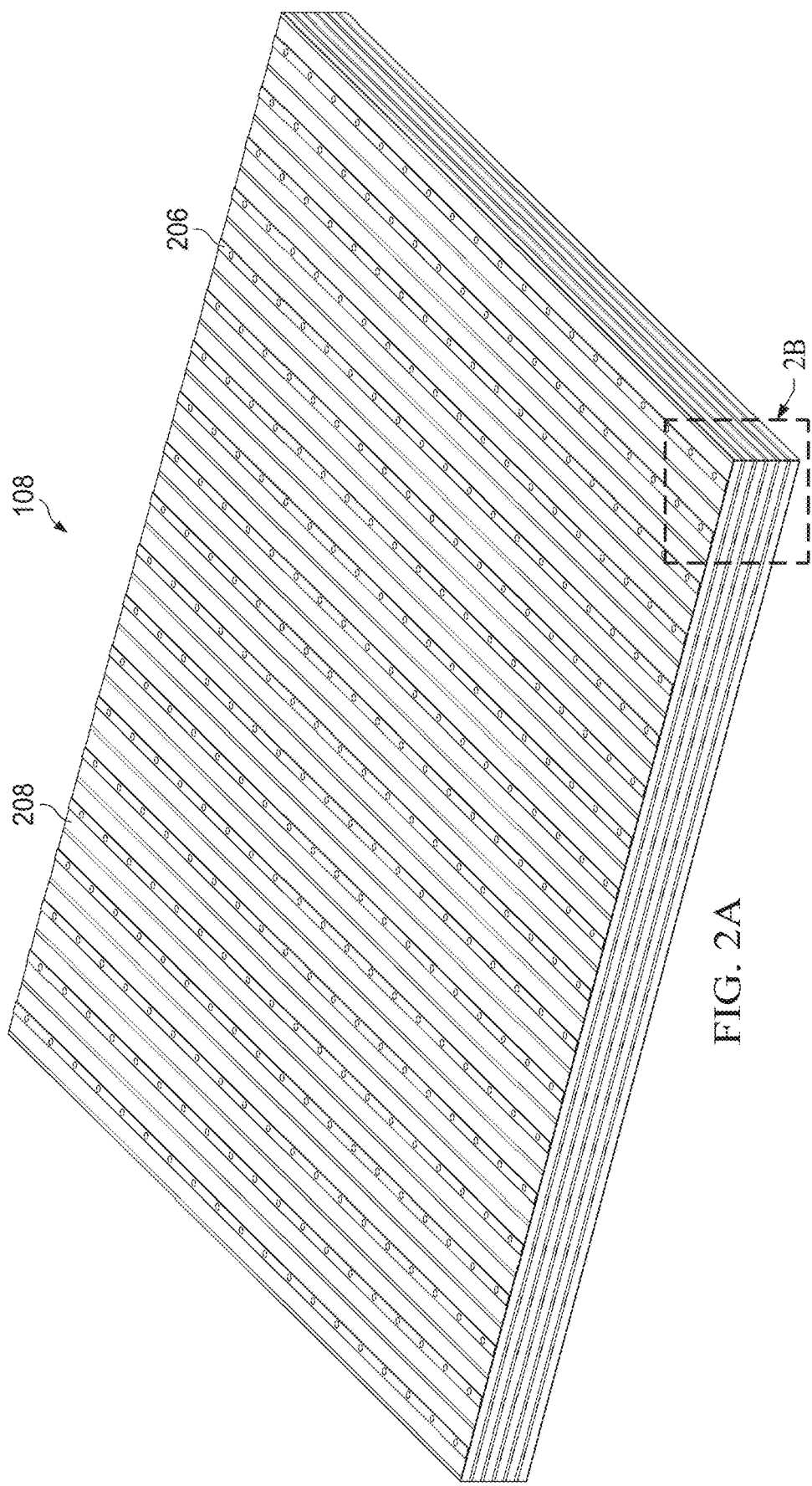
Figure 3A:
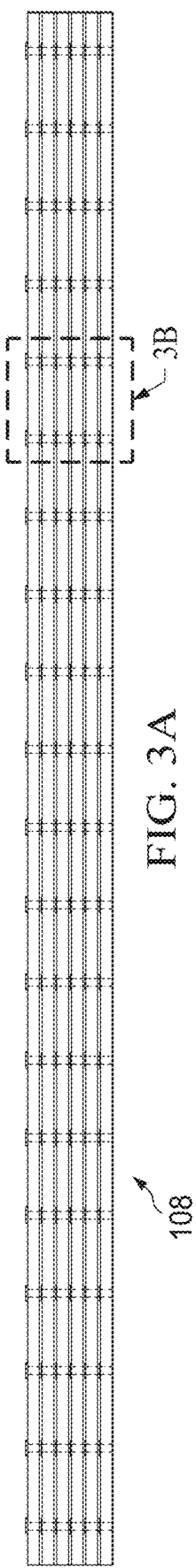
FIGS. 3A and 3B illustrate a side view of an example printed-circuit isolation barrier for co-site interference mitigation in accordance with this disclosure.
Figure 3B:
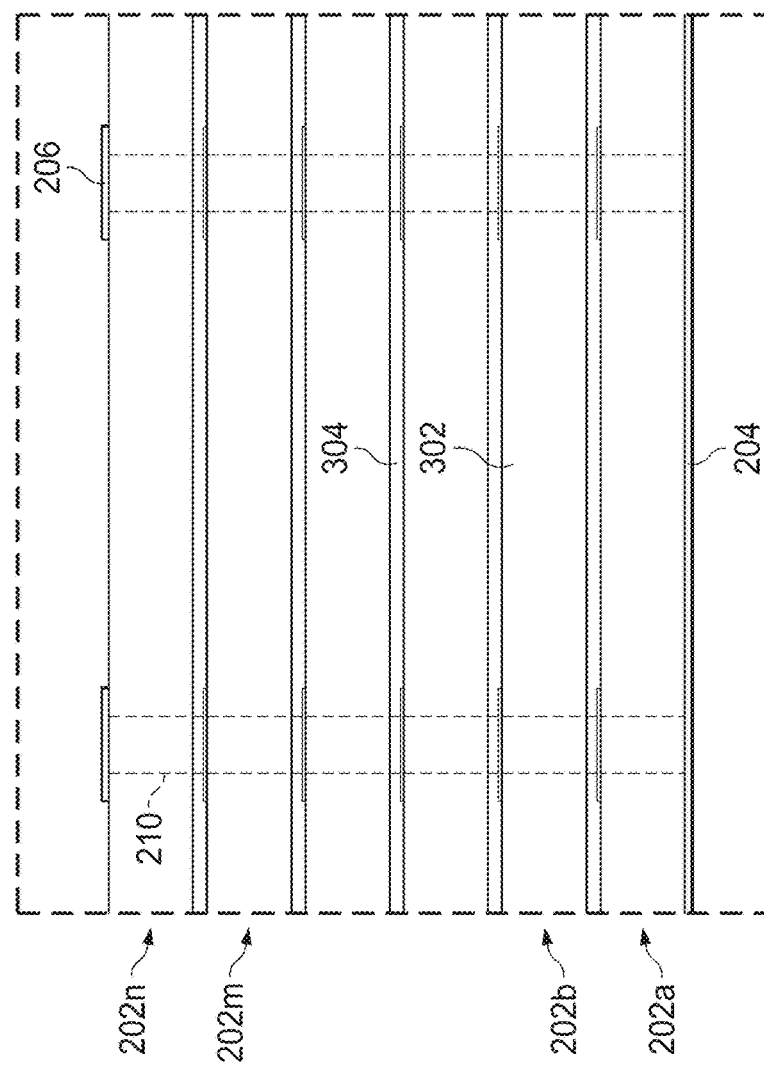
Figure 4B:
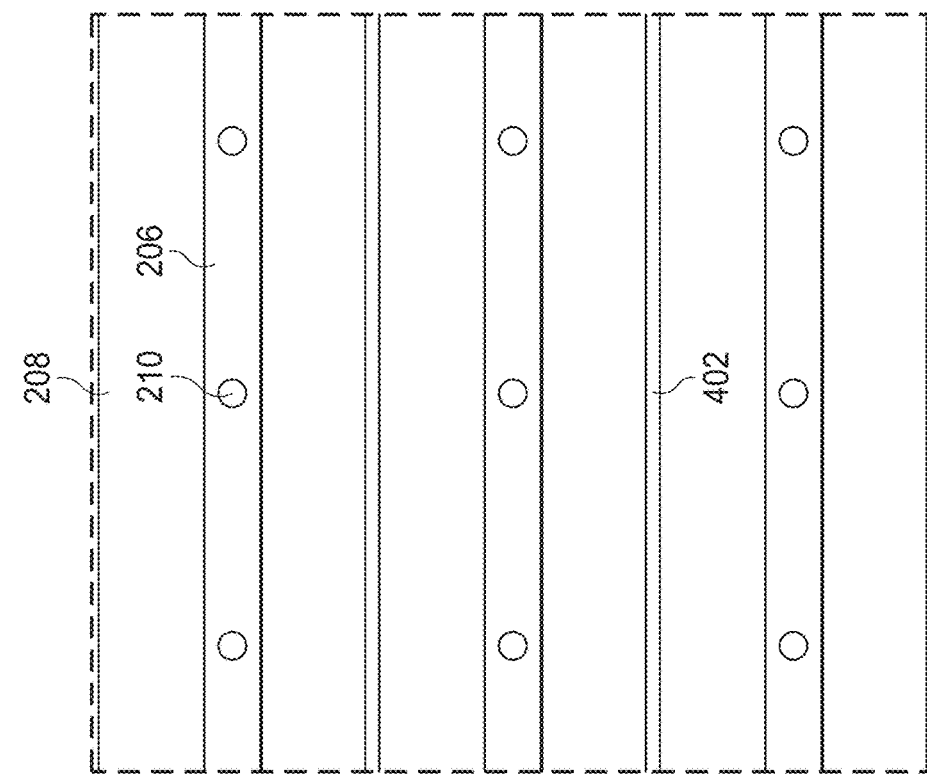
FIGS. 4A and 4B illustrate a top view of an example printed-circuit isolation barrier for co-site interference mitigation in accordance with this disclosure.
Figure 4A:
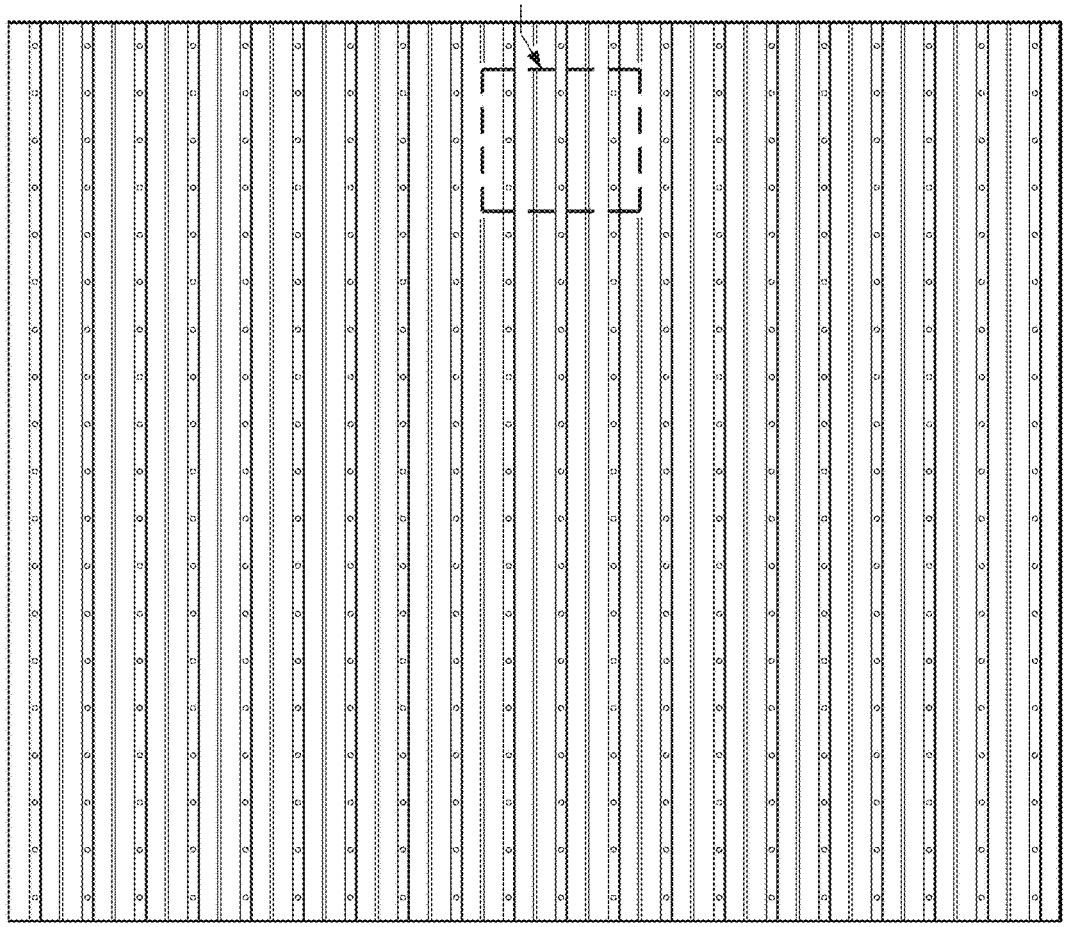

FIGS. 2A and 2B illustrate a perspective view of an example printed-circuit isolation barrier 108 for co-site interference mitigation in accordance with this disclosure. FIGS. 3A and 3B illustrate a side view of the example printed-circuit isolation barrier 108 for co-site interference mitigation in accordance with this disclosure. FIGS. 4A and 4B illustrate a top view of the example printed-circuit isolation barrier 108 for co-site interference mitigation in accordance with this disclosure. For ease of explanation, the isolation barrier 108 of FIGS. 2A through 4B is described as being used in the system 100 of FIG. 1. However, the isolation barrier 108 shown in FIGS. 2A through 4B may be used with any suitable antennas and in any suitable systems.

As shown in FIGS. 2A through 4B, the isolation barrier 108 here is formed using multiple layers 202a-202n over a base layer 204. Each of the multiple layers 202a-202n includes copper or other conductive strips 206 that are electrically coupled to thin-film resistive structures 208. Also, conductive vias 210 are formed through the layers 202a-202n and are used to electrically couple components of the multiple layers 202a-202n together and to the base layer 204. In this example, the vias 210 are positioned along the conductive strips 206 and electrically couple the conductive strips 206 to one another, and the conductive strips 206 are electrically coupled to the thin-film resistive structures 208. Note that the base layer 204 here may represent the ground plane 106 in some embodiments. Also note that, while not shown, any other suitable layers may be here, such as a protective layer over the top layer 202n.

In this example, each layer 202a-202n includes a dielectric material 302, and multiple conductive strips 206 and multiple thin-film resistive structures 208 may be formed on or over the dielectric material 302. The dielectric material 302 of each layer 202a-202n may be formed from any suitable electrically-insulative material(s), such as FR-4 glass-reinforced epoxy resin laminate or other PCB substrate material. As a particular example, the dielectric material 302 of each layer 202a-202n may include the 370HR Core 2x7648-42 material from ISOLA GROUP, which in some cases may have a nominal thickness of about 355.6 microns. To support stacking of the layers 202a-202n, the dielectric material 302 of each layer 202b-202n above the first layer 202a may also include the 370HR Prepreg 106-76 material from ISOLA GROUP, which in some cases may have a nominal thickness of about 60.96 microns. The dielectric material 302 of each layer 202a-202n may also be formed in any suitable manner and may have any suitable size, shape, and dimensions.

The conductive strips 206 may each be formed from any suitable electrically-conductive material(s), such as one or more metals. In some embodiments, each of the conductive strips 206 may be formed using copper. Each conductive strip 206 here is shown as being an elongated structure with a high aspect ratio, and in some cases each conductive strip 206 may extend substantially or completely across the length or width of the isolation barrier 108. Each of the conductive strips 206 may have any suitable size, shape, and dimensions. The conductive strips 206 for the top layer 202n here are shown as having a larger thickness than the conductive strips 206 for the other layers 202a-202m, although this need not be the case. In some cases, each conductive strip 206 may have a nominal width of about 508.0 microns, each conductive strip 206 for the layers 202a-202m may have a nominal thickness of about 17.78 microns, and each conductive strip 206 for the layer 202n may have a nominal thickness of about 35.56 microns.

The thin-film resistive structures 208 may also each be formed from any suitable electrically-conductive material(s), such as one or more metals. Each thin-film resistive structure 208 here is shown as being an elongated structure with a high aspect ratio, and in some cases each thin-film resistive structure 208 may extend substantially or completely across the length or width of the isolation barrier 108. In some embodiments, each of the thin-film resistive structures 208 may be formed using conductive foil, such as the TCR thin-film material from TICER TECHNOLOGIES. Each thin-film resistive structure 208 may also have any suitable electrical resistance, such as about 250 Ohms per square (OPS) or other suitable resistance. Each of the thin-film resistive structures 208 may have any suitable size, shape, and dimensions. In some embodiments, each thin-film resistive structure 208 may have a nominal width of about 2.54 millimeters.

The conductive strips 206 and the thin-film resistive structures 208 may each be formed in any suitable manner. In some cases, for instance, the material(s) forming the thin-film resistive structures 208 may be deposited or otherwise formed over the dielectric material 302 and then etched to fabricate the thin-film resistive structures 208. Similarly, the material(s) forming the conductive strips 206 may be deposited or otherwise formed over the dielectric material 302/thin-film resistive structures 208 and then etched to fabricate the conductive strips 206. Note, however, that the conductive strips 206 and the thin-film resistive structures 208 may be fabricated in any other suitable manner.

The base layer 204 represents a layer of conductive material on or over which the layers 202a-202n may be formed or otherwise positioned. The base layer 204 may also be coupled to an external structure in order to hold the isolation barrier 108 in place and possibly to provide a path for thermal energy to move out of the isolation barrier 108 and into the external structure, or the base layer 204 may represent the ground plane 106 (which in some cases may represent a portion of the external structure). The base layer 204 may be formed from any suitable conductive material (s), such as one or more metals, and in any suitable manner. The base layer 204 may also have any suitable size, shape, and dimensions.

As shown in FIGS. 3A and 3B, an adhesive 304 may be used to secure the multiple layers 202a-202n together to form a stack of components. Any suitable adhesive may be used here to secure the layers 202a-202n together. Note, however, that any other suitable mechanism may be used to attach layers 202a-202n. Also, in this case, it is assumed that at least parts of the multiple layers 202a-202n are formed separately and then stacked and held together using the adhesive 304. However, the multiple layers 202a-202n may also be formed sequentially on top of one another to form the stacked structure of the isolation barrier 108.

The vias 210 are formed through the layers 202a-202n and are used to form electrical connections between the layers 202a-202n. In some embodiments, the vias 210 may be formed by drilling or otherwise forming holes through the various layers 202a-202n and at least partially filling the holes with one or more conductive materials, such as one or more metals like copper. The formation of the holes may be performed using any suitable technique, such as physical drilling or laser drilling. In other cases, the vias 210 may be formed as part of an additive manufacturing process. The vias 210 may also have any suitable uniform or non-uniform spacing. In some cases, consecutive vias 210 along each conductive strip 206 may be separated from one another by about 2.286 millimeters. In addition, the vias 210 may have any suitable size, shape, and dimensions, and different vias 210 may or may not have the same size, shape, and dimensions. In some cases, for instance, each via 210 may have a nominal diameter of about 254 microns. Note that the vias 210 may or may not have a substantially constant spacing along the conductive strips 206.

Adjacent ones of the thin-film resistive structures 208 as shown in

FIGS. 4A and 4B are separated from one another by gaps 402. The gaps 402 are what separate different thin-film resistive structures 208 from one another and give the thin-film resistive structures 208 their elongated form. The gaps 402 may have any suitable size, such as from about 127 microns to about 381 microns. The gaps 402 may also be formed in any suitable manner, such as via etching. Note, however, that the use of the gaps 402 is optional. If omitted, the thin-film resistive structures 208 may instead represent a substantially integrated structure that spans most or all of the length and width of each layer 202a-202n.

Overall, the isolation barrier 108 may itself have any suitable size, shape, and dimensions. Based on the dimensions provided above, for example, some embodiments of the isolation barrier 108 may have a nominal overall height of about 2.5908 millimeters. Also, the isolation barrier 108 may have one or more characteristics that make the isolation barrier 108 more suitable for use in various applications than radar absorbing materials. For example, the ECCOSORB MF-117 absorber material from LAIRD TECHNOLOGIES, INC. is a common material often used for co-site interference mitigation. The ECCOSORB MF-117 absorber material has a thermal conductivity of about 1.44 W/mK and a density of about 4.2 g/cm$^3$. Some embodiments of the isolation barrier 108 that use copper and the 370HR dielectric material may have a composite thermal conductivity of about 3.8 W/mK and a composite density of about 1.9 g/cm$^3$. In other words, the isolation barrier 108 may have better than twice the thermal conductivity of the ECCOSORB MF-117 absorber material while having less than half the density of the ECCOSORB MF-117 absorber material. Thus, the isolation barrier 108 may be used (among other times) when improved thermal performance or less weight is needed. On the other hand, if improved low-frequency performance is desired, the thickness and perhaps the number of layers of the isolation barrier 108 can be increased while the weight per unit area is equal to or less than that of an ECCOSORB MF-117 layer of the same thickness It should be noted that the performance of the isolation barrier 108 can vary based on the frequency of the electromagnetic energy being absorbed. The same is often true for other approaches, such as those using the ECCOSORB MF-117 absorber material. Also, the performance of the isolation barrier 108 can vary based on certain design parameters of the isolation barrier 108, such as the size of the gaps 402 used between the thin-film resistive structures 208 and the overall thickness of the isolation barrier 108. As a result, the insertion loss and the return loss of the isolation barrier 108 can vary based on the design of the isolation barrier 108 and the frequency of the electromagnetic energy being absorbed. In general, embodiments of the isolation barrier 108 with various design features (such as different thicknesses and gap sizes) may have similar return losses as the ECCOSORB MF-117 absorber material. The embodiments of the isolation barrier 108 may also, at various frequencies, achieve higher insertion losses (meaning better measures of electrical isolation) than the ECCOSORB MF-117 absorber material.

The base layer 204, conductive strips 206, thin-film resistive structures 208, and conductive vias 210 here form a conductive corrugated structure in which the vias 210 help to form walls of the corrugations and the conductive strips 206 and thin-film resistive structures 208 help to absorb electromagnetic energy. More specifically, the corrugations help to guide the electromagnetic energy through the multiple layers 202a-202n with the thin-film resistive structures 208 so that the electromagnetic energy can be trapped within the corrugations and absorbed. This enables effective termination of the electromagnetic energy, which becomes heat that can be easily transferred out of the isolation barrier 108.

Although FIGS. 2A through 4B illustrate a perspective view, a side view, and a top view of one example of a printed-circuit isolation barrier 108 for co-site interference mitigation, various changes may be made to FIGS. 2A through 4B. For example, the sizes, shapes, and dimensions of the isolation barrier 108 and its individual components can vary as needed or desired, and various elements can be repositioned within the isolation barrier 108 as needed or desired. As a particular example, while specific numerical dimensions and specific materials are provided above for the isolation barrier 108 and its individual components, these values and materials are examples only, and the dimensions and materials used can vary from those described above.

Figure 5:
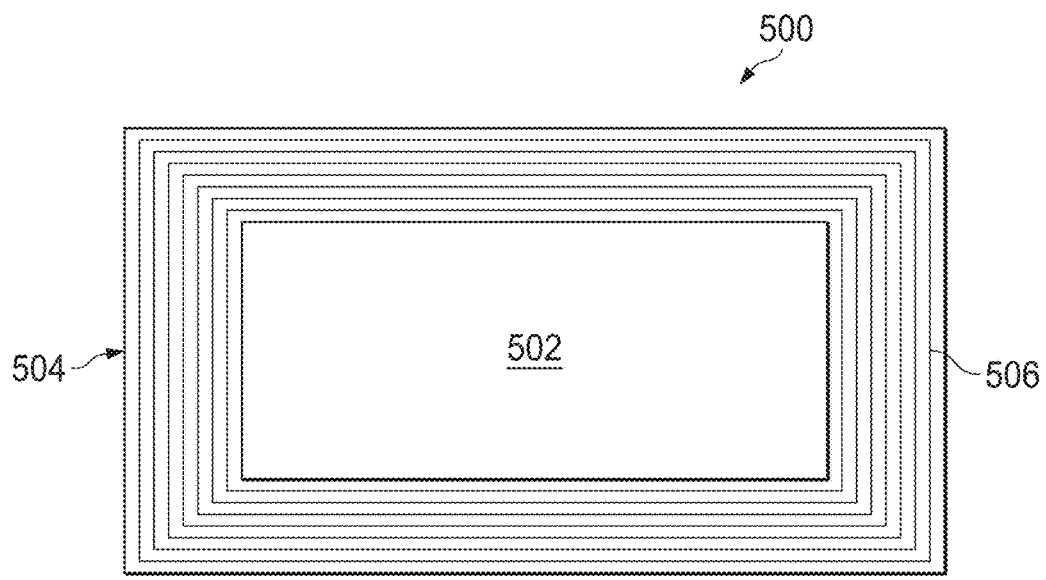
FIGS. 5 and 6 illustrate other example systems supporting co-site interference mitigation in accordance with this disclosure.
Figure 6:
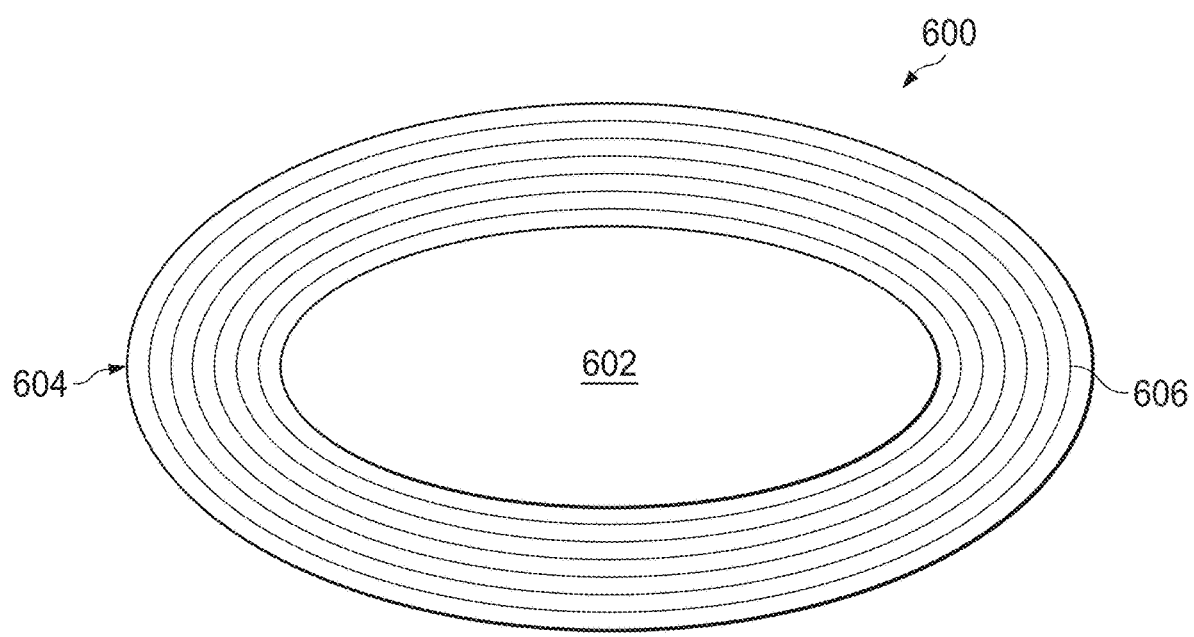

FIGS. 5 and 6 illustrate other example systems 500 and 600 supporting co-site interference mitigation in accordance with this disclosure. In the example system 100 shown in FIG. 1, the isolation barrier 108 can be positioned between or alongside the antennas 102 and 104. In the example shown in FIG. 5, the system 500 includes an antenna 502 and an isolation barrier 504 positioned around the antenna 502. In this example, the isolation barrier 504 includes multiple layers of conductive strips 506, which may be the same as or similar to the conductive strips 206. The isolation barrier 504 also includes thin-film resistive structures 208, vias 210, and other components of the isolation barrier 108 described above. Here, the antenna 502 is rectangular or otherwise includes straight sides, and different conductive strips 506 extend in different directions around the antenna 502. Note that these conductive strips 506 may be electrically coupled together to form conductive loops around the antenna 502.

In the example shown in FIG. 6, the system 600 includes an antenna 602 and an isolation barrier 604 positioned around the antenna 602. In this example, the isolation barrier 604 includes multiple layers of conductive strips 606, which may be the same as or similar to the conductive strips 206 (except the conductive strips 606 are shown as being curved). The isolation barrier 604 also includes thin-film resistive structures 208, vias 210, and other components of the isolation barrier 108 described above (except these components may be curved). Here, the antenna 602 is elliptical or otherwise includes curved sides, and different conductive strips 606 extend in different directions around the antenna 602.

In some cases, an isolation barrier may function at maximum effectiveness when its corrugations are perpendicular to the direction that an antenna's electromagnetic fields would propagate across the ground plane 106 in the absence of the isolation barrier. Thus, in FIG. 5, the corrugations are generally straight and extend along the four sides of the antenna 502. In FIG. 6, the corrugations are generally curved and follow the curved path of the antenna 602.

Although FIGS. 5 and 6 illustrate other examples of systems 500, 600 supporting co-site interference mitigation, various changes may be made to FIGS. 5 and 6. For example, the same structure 500 or 600 may be replicated for use with multiple antennas. Also, the shapes of the antennas 502, 602 shown here are for illustration only and can vary as needed or desired. Other example types of antennas that may be used here include array, horn or open-ended waveguide, patch, and dipole antennas.

The following describes example embodiments of this disclosure that implement or relate to a printed-circuit isolation barrier for co-site interference mitigation. However, other embodiments may be used in accordance with the teachings of this disclosure.

In a first embodiment, an apparatus includes an isolation barrier configured to absorb electromagnetic energy. The isolation barrier includes multiple layers stacked on one another. Each of the multiple layers includes at least one dielectric material, at least one thin-film resistive material carried by the at least one dielectric material, and conductive strips in electrical contact with the at least one thin-film resistive material. The isolation barrier also includes vias through the multiple layers.

Multiple ones of the vias are positioned along each of the conductive strips, and the vias electrically couple the conductive strips in the multiple layers to one another. The isolation barrier is configured to guide the electromagnetic energy through the multiple layers to enable absorption of the electromagnetic energy by the at least one thin-film resistive material.

In a second embodiment, a system includes a ground plane and multiple antennas each configured to transmit or receive electromagnetic signals. The system also includes at least one isolation barrier configured to absorb electromagnetic energy transmitted from one of the antennas in order to reduce an amount of the electromagnetic energy received at another of the antennas. Each isolation barrier includes multiple layers stacked on one another. Each of the multiple layers includes at least one dielectric material, at least one thin-film resistive material carried by the at least one dielectric material, and conductive strips in electrical contact with the at least one thin-film resistive material. Each isolation barrier also includes vias through the multiple layers. Multiple ones of the vias are positioned along each of the conductive strips, and the vias electrically couple the conductive strips in the multiple layers to one another and to the ground plane. Each isolation barrier is configured to guide the electromagnetic energy through the multiple layers to enable absorption of the electromagnetic energy by the at least one thin-film resistive material.

In a third embodiment, a method includes forming an isolation barrier configured to absorb electromagnetic energy transmitted from one of multiple antennas in order to reduce an amount of the electromagnetic energy received at another of the multiple antennas. Forming the isolation barrier includes forming multiple layers stacked on one another. Each of the multiple layers includes at least one dielectric material, at least one thin-film resistive material carried by the at least one dielectric material, and conductive strips in electrical contact with the at least one thin-film resistive material. Forming the isolation barrier also includes forming vias through the multiple layers. Multiple ones of the vias are positioned along each of the conductive strips, and the vias electrically couple the conductive strips in the multiple layers to one another. The isolation barrier is configured to guide the electromagnetic energy through the multiple layers to enable absorption of the electromagnetic energy by the at least one thin-film resistive material.

Any single one or any suitable combination of the following features may be used with the first, second, or third embodiment. In each of the multiple layers, each conductive strip may include an elongated conductive structure, and the multiple vias positioned along each conductive strip may have a substantially constant spacing along the elongated conductive structure. In each of the multiple layers, the at least one thin-film resistive material may form elongated resistive structures that are separated from one another by gaps in the at least one thin-film resistive material, and different ones of the conductive strips may be electrically coupled to different ones of the elongated resistive structures. The gaps may affect a low-frequency performance of the associated isolation barrier. The vias may be configured to transport thermal energy to a ground plane for removal of the thermal energy from the isolation barrier. The isolation barrier may be formed using a printed circuit board fabrication technique. The isolation barrier may lack a radar absorbing material. Multiple antennas may be positioned along one or more sides of the isolation barrier.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure.

What is claimed is:

1. An apparatus comprising:
   an isolation barrier configured to absorb electromagnetic energy, the isolation barrier comprising:
      multiple layers stacked on one another, each of the multiple layers comprising at least one dielectric material, at least one thin-film resistive material carried by the at least one dielectric material, and conductive strips in electrical contact with the at least one thin-film resistive material; and
      vias through the multiple layers, multiple ones of the vias positioned along each of the conductive strips, the vias electrically coupling the conductive strips in the multiple layers to one another;
   wherein the isolation barrier is configured to guide electromagnetic energy through the multiple layers to enable absorption of the electromagnetic energy by the at least one thin-film resistive material.

2. The apparatus of claim 1, wherein, in each of the multiple layers:
   each conductive strip comprises an elongated conductive structure; and
   the multiple vias positioned along each conductive strip have a substantially constant spacing along the elongated conductive structure.

3. The apparatus of claim 1, wherein, in each of the multiple layers:
   the at least one thin-film resistive material forms elongated resistive structures that are separated from one another by gaps in the at least one thin-film resistive material; and
   different ones of the conductive strips are electrically coupled to different ones of the elongated resistive structures.

4. The apparatus of claim 3, wherein the gaps affect a low-frequency performance of the isolation barrier.

5. The apparatus of claim 1, wherein the vias are configured to transport thermal energy to a ground plane for removal of the thermal energy from the isolation barrier.

6. The apparatus of claim 1, wherein the isolation barrier is formed using a printed circuit board fabrication technique.

7. The apparatus of claim 1, wherein the isolation barrier lacks a radar absorbing material.

8. A system comprising:
   a ground plane;
   multiple antennas each configured to transmit or receive electromagnetic signals; and
   at least one isolation barrier configured to absorb electromagnetic energy transmitted from one of the antennas in order to reduce an amount of the electromagnetic energy received at another of the antennas, each isolation barrier comprising:
      multiple layers stacked on one another, each of the multiple layers comprising at least one dielectric material, at least one thin-film resistive material carried by the at least one dielectric material, and conductive strips in electrical contact with the at least one thin-film resistive material; and
      vias through the multiple layers, multiple ones of the vias positioned along each of the conductive strips, the vias electrically coupling the conductive strips in the multiple layers to one another and to the ground plane;
   wherein each isolation barrier is configured to guide the electromagnetic energy through the multiple layers to enable absorption of the electromagnetic energy by the at least one thin-film resistive material.

9. The system of claim 8, wherein, in each of the multiple layers:
   each conductive strip comprises an elongated conductive structure; and
   the multiple vias positioned along each conductive strip have a substantially constant spacing along the elongated conductive structure.

10. The system of claim 8, wherein, in each of the multiple layers of each isolation barrier:
    the at least one thin-film resistive material forms elongated resistive structures that are separated from one another by gaps in the at least one thin-film resistive material; and
    different ones of the conductive strips are electrically coupled to different ones of the elongated resistive structures.

11. The system of claim 10, wherein the gaps affect a low-frequency performance of the associated isolation barrier.

12. The system of claim 8, wherein, in each isolation barrier, the vias are configured to transport thermal energy to the ground plane for removal of the thermal energy from the isolation barrier.

13. The system of claim 8, wherein each isolation barrier is formed using a printed circuit board fabrication technique.

14. The system of claim 8, wherein each isolation barrier lacks a radar absorbing material.

15. The system of claim 8, wherein the multiple antennas are positioned along one or more sides of the at least one isolation barrier.

16. A method comprising:
    forming an isolation barrier configured to absorb electromagnetic energy transmitted from one of multiple antennas in order to reduce an amount of the electromagnetic energy received at another of the multiple antennas;
    wherein forming the isolation barrier comprises:
       forming multiple layers stacked on one another, each of the multiple layers comprising at least one dielectric material, at least one thin-film resistive material carried by the at least one dielectric material, and conductive strips in electrical contact with the at least one thin-film resistive material; and forming vias through the multiple layers, multiple ones of the vias positioned along each of the conductive strips, the vias electrically coupling the conductive strips in the multiple layers to one another; and wherein the isolation barrier is configured to guide the electromagnetic energy through the multiple layers to enable absorption of the electromagnetic energy by the at least one thin-film resistive material.

17. The method of claim 16, wherein, in each of the multiple layers:

the at least one thin-film resistive material forms elongated resistive structures that are separated from one another by gaps in the at least one thin-film resistive material; and different ones of the conductive strips are electrically coupled to different ones of the elongated resistive structures.

18. The method of claim 17, wherein the gaps affect a low-frequency performance of the isolation barrier.

19. The method of claim 16, wherein the isolation barrier is formed using a printed circuit board fabrication technique.

20. The method of claim 16, further comprising:

positioning the isolation barrier such that the multiple antennas are located along one or more sides of the isolation barrier.

* * * * *